United States Patent
Ruppi

(10) Patent No.: US 7,163,735 B2
(45) Date of Patent: Jan. 16, 2007

(54) ENHANCED ALUMINA LAYER PRODUCED BY CVD

(75) Inventor: Sakari Ruppi, Fagersta (SE)

(73) Assignee: Seco Tools AB, Fagersta (SE)

( * ) Notice: Subject to any disclaimer, the term of this patent is extended or adjusted under 35 U.S.C. 154(b) by 34 days.

(21) Appl. No.: 10/431,505

(22) Filed: May 8, 2003

(65) Prior Publication Data

US 2004/0028951 A1    Feb. 12, 2004

(30) Foreign Application Priority Data

May 8, 2002 (SE) .................................. 0201417

(51) Int. Cl.
*B32B 9/00* (2006.01)
(52) U.S. Cl. .................. 428/216; 51/307; 51/309; 428/325; 428/336; 428/697; 428/698; 428/699; 428/701; 428/702
(58) Field of Classification Search ............... 51/307, 51/309; 428/325, 336, 216, 697, 698, 699, 428/701, 702
See application file for complete search history.

(56) References Cited

U.S. PATENT DOCUMENTS

| | | | |
|---|---|---|---|
| 5,137,774 A | 8/1992 | Ruppi | |
| 5,654,035 A | 8/1997 | Ljungberg et al. | |
| 5,861,210 A * | 1/1999 | Lenander et al. | ........... 428/698 |
| 5,863,640 A | 1/1999 | Ljungberg et al. | |
| 5,945,207 A * | 8/1999 | Kutscher et al. | ............... 51/309 |
| 5,980,988 A | 11/1999 | Ljungberg | |
| 6,254,984 B1 * | 7/2001 | Iyori | ........................... 428/336 |
| 6,284,356 B1 * | 9/2001 | Kiriyama | .................... 428/699 |
| 6,333,098 B1 * | 12/2001 | Olsson et al. | ................. 428/216 |
| 6,333,103 B1 | 12/2001 | Ishii et al. | |
| 6,436,519 B1 * | 8/2002 | Holzschuh | .................. 428/697 |
| 6,713,172 B1 * | 3/2004 | Ljungberg et al. | .......... 428/701 |
| 6,869,668 B1 | 3/2005 | Martensson | |
| 2001/0006724 A1 | 7/2001 | Holzschuh | |

FOREIGN PATENT DOCUMENTS

| | | |
|---|---|---|
| EP | 0 603 144 A | 6/1994 |
| EP | 1 247 789 A | 10/2002 |
| JP | 55 100978 A | 8/1980 |
| JP | 05295517 | * 11/1993 |
| WO | 98/10119 A | 3/1998 |

OTHER PUBLICATIONS

Luthier et al "Magnetron Sputtered TiAlON composite thin films.I. Strudture and morphology" J.Vac. Sci. Technol A 9(1) Jan./Feb. 1991. p. 102-109.*
Kawata et al "Characterization of multilayer films of Ti-Al-O-C-N system prepared by p8ulsed d.c. plasma-enhaced chemical vapor deposition" Thin Solid Films 390 (2001) p. 64-69.*
Swedish Office Action dated Nov. 8, 2002.
Theoretical Structure Determination of a Complex Material: k-$Al_2O_3$—Journal of the American Ceramic Society—Yourdshahyan et al. (vol. 82, No. 6).

* cited by examiner

*Primary Examiner*—Archene Turner
(74) *Attorney, Agent, or Firm*—Drinker Biddle & Reath LLP

(57) ABSTRACT

The present invention introduces a new and refined method to produce $\alpha$-$Al_2O_3$ layers with substantially better wear resistance and toughness than the prior art. The $\alpha$-$Al_2O_3$ layer of the present invention is formed on a bonding layer of (Ti,Al)(C,O,N) with increasing aluminium content towards the outer surface. Nucleation of $\alpha$-$Al_2O_3$ is obtained through a nucleation step being composed of both aluminising and oxidisation steps. The $\alpha$-$Al_2O_3$ layer according to this invention has a thickness ranging from 1 to 20 μm and is composed of columnar grains. The length/width ratio of the alumina grains is from 2 to 12, preferably 5 to 9. The layer is characterised by a strong (012) growth texture, measured using XRD, and by the almost total absence (104), (110), (113) and (116) diffraction peaks.

33 Claims, No Drawings

ENHANCED ALUMINA LAYER PRODUCED BY CVD

FIELD OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

The present invention relates to a substrate of cemented carbide, cermet or ceramics onto which a hard and wear resistant coating is deposited. The coating is adherently bonded to the substrate and covers all functional parts thereof. The coating is composed of one or more refractory layers of which at least one layer is a strongly textured alpha-alumina ($\alpha$-$Al_2O_3$).

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

A crucial step in deposition of different $Al_2O_3$ polymorphs is the nucleation step. $\kappa$-$Al_2O_3$ can be grown in a controlled way on {111} planes of TiN, Ti(C,N) or TiC having the face-centered cubic structure. Transmission electron microscopy (TEM) has confirmed the growth mode which is that of the close-packed (001) planes of $\kappa$-$Al_2O_3$ on the close-packed {111} planes of the cubic phase with the following epitaxial orientation relationships: $(001)_\kappa // (111)_{\overline{B}X}$; $[100]_\kappa // [112]_{\overline{B}X}$. An explanation and a model for the CVD growth of metastable $\kappa$-$Al_2O_3$ has been proposed (Y. Yoursdshahyan, C. Ruberto, M. Halvarsson, V. Langer, S. Ruppi, U. Rolander and B. I. Lundqvist, Theoretical Structure Determination of a Complex Material: $\kappa$-$Al_2O_3$, J. Am. Ceram. Soc. 82(6)1365–1380 (1999)).

When properly nucleated, $\kappa$-$Al_2O_3$ layers can be grown to a considerable thickness (>10 $\mu$m). The growth of even thicker layers of $\kappa$-$Al_2O_3$ can be ensured through re-nucleation on thin layers of, for example, TiN inserted in the growing $\kappa$-$Al_2O_3$ layer. When nucleation is ensured the $\kappa \rightarrow \alpha$ transformation can be avoided during deposition by using a relatively low deposition temperature (<1000° C.). During metal cutting high temperature conditions may be created such that the $\kappa \rightarrow \alpha$ phase transformation has been confirmed to occur. In addition to phase stability there are several reasons why $\alpha$-$Al_2O_3$ should be preferred for many metal cutting applications. ($\alpha$-$Al_2O_3$ exhibits better wear properties in cast iron, as discussed in U.S. Pat. No. 5,137,774. Further, a layer which has been nucleated as $\alpha$-$Al_2O_3$ does not contain any transformation cracks and stresses. Nucleated $\alpha$-$Al_2O_3$ should be more ductile than $\alpha$-$Al_2O_3$ formed totally or partially as a result of phase transformation, and even more ductile than $\kappa$-$Al_2O_3$, the plasticity of which is limited by the defect structure.

However, a stable $\alpha$-$Al_2O_3$ phase has been found to be more difficult to be nucleated and grown at reasonable CVD temperatures than the metastable $\kappa$-$Al_2O_3$. It has been experimentally confirmed that $\alpha$-$Al_2O_3$ can be nucleated, for example, on $Ti_2O_3$ surfaces, bonding layers of (Ti,Al)(C,O), as shown in U.S. Pat. No. 5,137,774, or by controlling the oxidation potential using $CO/CO_2$ mixtures, as shown in U.S. Pat. No. 5,654,035. The bottom line in all these approaches is that nucleation must not take place on the 111-surfaces of TiC, TiN, Ti(C,N) or Ti(C,O,N), otherwise $\kappa$-$Al_2O_3$ is obtained.

It should also be noted that in conventional prior art methods higher deposition temperatures are usually used to deposit $\alpha$-$Al_2O_3$. When the nucleation control is not complete, as is the case in many conventional products, the resulting $\alpha$-$Al_2O_3$ layers have, at least partly, been formed as a result of the $\kappa$-$Al_2O_3 \rightarrow \alpha$-$Al_2O_3$ phase transformation. This is especially the case when thick $Al_2O_3$ layers are considered. These kind of $\alpha$-$Al_2O_3$ layers are composed of larger grains with phase-transformation cracks. These coatings exhibit much lower mechanical strength and ductility than $\alpha$-$Al_2O_3$ coatings that are composed of nucleated $\alpha$-$Al_2O_3$.

The control of the $\alpha$-$Al_2O_3$ polymorph on an industrial scale was achieved in the beginning of the 1990's with commercial products based on U.S. Pat. No. 5,137,774. In addition, $\alpha$-$Al_2O_3$ has been deposited with preferred coating textures. In U.S. Pat. No. 5,654,035 an alumina layer textured in the (012) direction, and in U.S. Pat. No. 5,980,988 an alumina layer textured in the (110) direction are disclosed. In U.S. Pat. No. 5,863,640 a preferred growth either along (012), (104), or (110) directions is disclosed. U.S. Pat. No. 6,333,103 describes a modified method to control the nucleation and growth of $\alpha$-$Al_2O_3$ along the (10(10)) direction.

SUMMARY OF THE INVENTION

The present invention provides a new, improved alumina layer where the $\alpha$-$Al_2O_3$ phase is nucleated $\alpha$-$Al_2O_3$ with a strong, fully controlled (112) growth texture.

According to one aspect, the present invention provides cutting tool insert comprising a substrate having a surface at least partially coated with a coating, the coating having a total thickness of about 10–40 $\mu$m, one or more refractory layers of which at least one layer is an alumina layer, the alumina layer being composed of columnar $\alpha$-$Al_2O_3$ grains with texture coefficients expressed as TC(hkl) of:

a) TC(012) and TC(024) both >1.8; and
b) TC(104), TC(110), TC(113) and TC(116) all <0.4;
wherein the texture coefficient TC(hkl) is defined as:

$$TC(hkl) = \frac{I(hkl)}{I_0(hkl)} \left\{ \frac{1}{n} \sum \frac{I(hkl)}{I_0(hkl)} \right\}^{-1}$$

where
I(hkl)=measured intensity of the (hkl) reflection
$I_0$(hkl)=standard intensity according to JCPDS card no 46-1212
n=number of reflections used in the calculation
(hkl) reflections used are: (012), (104), (110), (113), (024), (116).

According to another aspect, the present invention provides a method of forming a coating, the method comprising: (i) forming a coating of (Ti,Al)(C,)N); and (ii) modifying the as-formed coating by applying alternating aluminising and oxidising treatments thereto, whereby the coating is provided with an aluminium content which increases toward the surface thereof.

DETAILED DESCRIPTION OF THE INVENTION

It has been surprisingly found that $\alpha$-$Al_2O_3$ layers having a strong, fully controlled (112) growth texture outperform conventional coatings which have random or other textures such as (011). The coating according the present invention is essentially free from transformation stresses, having columnar $\alpha$-$Al_2O_3$ grains with low dislocation density and with improved cutting properties.

According to the present invention, a method has been found to control the nucleation step of $\alpha$-$Al_2O_3$ so that a strong (012)-texture can be obtained. The method is characterized by the dominating presence of (012) texture coefficient and simultaneous absence of the other common TCs typically found in conventional coatings.

This kind of an $Al_2O_3$ layer is especially suited for use in toughness demanding steel cutting applications such as interrupted cutting, turning with coolant and especially intermittent turning with coolant. The other area is cast iron where the edge strength of this kind of alumina layer is superior to conventional cutting tools.

Before $\alpha$-$Al_2O_3$ is deposited on a CVD or MTCVD-applied Ti(C,N) coating, several steps are needed. First, a modified bonding layer, such as described in U.S. Pat. No. 5,137,774 (referred to as kappa-bonding in this patent), is deposited on the Ti(C,N) layer and is characterized by the presence of an Al concentration gradient. In addition, nitrogen gas is applied during deposition of this bonding layer. The aluminium content on the surface of this layer being considerably, about i.e. —30%, higher than in the bonding layer according to U.S. Pat. No. 5,137,774, and the bonding layer of the invention also contains nitrogen. The surface of this bonding layer is subjected to an additional treatment(s) using a $AlCl_3/H_2$ gas mixture in order to further increase the aluminium content. Subsequently, an oxidation treatment is performed using a $CO_2/H_2$ gas mixture. The oxidation step is short and may be followed by a short treatment with a $AlCl_3/H_2$ mixture, again followed by a short oxidisation step. These pulsating or alternating (Al-treatments/oxidisation) treatments create favourable nucleation sites for $\alpha$-$Al_2O_3$. The growth of the alumina layer onto the surface modified bonding layer is started by sequentially introducing the reactant gases in the following order: CO, $AlCl_3$, $CO_2$. The temperature shall preferably be about 1000° C.

The present invention also relates to a cutting tool insert comprising a substrate at least partially coated with a coating having a total thickness of 20–40 μm, preferably 15–25 μm. The coating composed of one or more refractory layers of which at least one layer is an alpha alumina layer. This $\alpha$-$Al_2O_3$ layer is dense and defect-free, and is composed of columnar grains with a strong (012) texture. The columnar grains have a length/width ratio of from 2 to 12, preferably 5 to 9. The columnar grains have a width of 0.5–2.5 μm, preferably 0.5–1.0 or 1.5–2.5 μm. The total thickness of the alumina layer, or "S", can be 2–5 μm when the grains are 0.5–1.0 μm, and can be 5–15 μm when the grains are 1.5–2.5 μm.

The texture coefficients (TC) for the $\alpha$-$Al_2O_3$ according to this invention layer is determined as follows:

$$TC(hkl) = \frac{I(hkl)}{I_0(hkl)} \left\{ \frac{1}{n} \sum \frac{I(hkl)}{I_0(hkl)} \right\}^{-1}$$

where
I(hkl)=intensity of the (hkl) reflection
$I_O$(hkl)=standard intensity according to JCPDS card no 46-1212
n=number of reflections used in the calculation
(hkl) reflections used are: (012), (104), (110), (113), (024), (116).

The texture of the alumina layer is defined as follows:
TC(012) and TC (024) >1.8, preferably 2.5–3.5, and simultaneously TC(104), TC(110), TC(113), TC(116) <0.4, preferably <0.3.

It is noted that the intensities of the planes 012 and 024 are related.

The substrate preferably comprises a hard material such as cemented carbide, cermets, ceramics, high speed steel or a superhard material such as cubic boron nitride (CBN) or diamond, preferably cemented carbide or CBN. When CBN is used, the substrate preferably material contains at least 40 vol-% CBN. In one preferred embodiment the substrate is a cemented carbide with a binder phase enriched surface zone.

The coating comprises a first layer adjacent the substrate of CVD Ti(C,N), CVD TiN, CVD TiC, MTCVD Ti(C,N), MTCVD Zr(C,N), MTCVD Ti(B,C,N), CVD HfN or combinations thereof, and is preferably of Ti(C,N) having a thickness of from 1 to 20 μm, preferably from 1 to 10 μm. An $\alpha$-$Al_2O_3$ refractory layer is provided adjacent the first layer having a thickness of from about 1 to 40 μm, preferably from 1 to 20 μm, most preferably from 1 to 10 μm.

According to one aspect, the refractory layer consists of $\alpha$-$Al_2O_3$ According to another aspect, the refractory layer consists essentially of $\alpha$-$Al_2O_3$, i.e.—the layer is mainly ($\alpha$-$Al_2O_3$, but may include minor amounts of impurities and/or other phases of $\alpha$-$Al_2O_3$. According to yet another aspect, the refractory layer comprises $\alpha$-$Al_2O_3$.

According to one embodiment, there is also an intermediate layer of TiN between the substrate and said first layer with a thickness of <3 μm, preferably 0.5–2 μm.

In one embodiment the $\alpha$-$Al_2O_3$ layer is the uppermost layer

In another embodiment there is another layer of carbide, nitride, carbonitride or carboxynitride of one or more of Ti, Zr and Hf, having a thickness of from about 0.5 to 3 μm, preferably 0.5 to 1.5 μm atop the $\alpha$-$Al_2O_3$ layer. This additional layer can have a thickness of from about 1 to 20 μm, preferably 2 to 8 μm.

In yet another embodiment the coating includes a layer of $\kappa$-$Al_2O_3$ and/or $\gamma$-$Al_2O_3$, preferably atop the $\alpha$-$Al_2O_3$, with a thickness of from 0.5 to 10 μm, preferably from 1 to 5 μm.

Specific illustrative, but non-limiting, examples of the above will now be described.

EXAMPLE 1

Cemented carbide cutting inserts with a composition of 5.9% Co and balance WC (hardness about 1600 HV) were coated with a layer of MTCVD Ti(C,N). The thickness of the MTCVD layer was about 8 μm. On to this layer 8 μm $\alpha$-$Al_2O_3$ was deposited "coating a" according to the present invention as defined below, and conventional "coating b". The inserts were studied by using XRD and the texture coefficients were determined. Table 1 shows the texture coefficients for the coating according to this invention and for the prior art coating. As can be seen a strong (012) texture is obtained according to this invention.

TABLE 1

| hkl | Invention (coating a) | Conventional (coating b) |
|-----|----------------------|--------------------------|
| 012 | 2.79 | 0.72 |
| 104 | 0.05 | 0.64 |
| 110 | 0.19 | 1.63 |
| 113 | 0.07 | 0.87 |
| 024 | 3.26 | 1.16 |
| 116 | 0.15 | 0.97 |

Deposition process of "coating a" (invention) is specified as follows:

Step 1: MTCVD coating

| | |
|---|---|
| Gas mixture | $TiCl_4$ = 4.0% |
| | $CH_3CN$ = 1.0% |
| | $N_2$ = 20% |
| | Balance: $H_2$ |
| Duration | 250 min |
| Temperature | 850° C. |
| Pressure | 100 mbar |

Step 2: Bonding layer

| | |
|---|---|
| Gas mixture | $TiCl_4$ = 2.8% |
| | $AlCl_3$ = 0.8–4.2% |
| | CO = 5.8% |
| | $CO_2$ = 2.2% |
| | $N_2$ = 5–6% |
| | Balance: $H_2$ |
| Duration | 60 min |
| Temperature | 1000° C. |
| Pressure | 100 mbar |

Step 3: Aluminising step

| | |
|---|---|
| Gas mixture | $AlCl_3$ = 0.8–4.2% |
| | Balance: $H_2$ |
| Duration | 15 min or 2 min pulsating |
| Temperature | 1000 C. |
| Pressure | 50 mbar |

Step 4: Oxidising step

| | |
|---|---|
| Gas mixture | $CO_2$ = 0.1% |
| | Balance: $H_2$ |
| Duration | 2 min or 20 s pulsating |
| Temperature | 1000 C. |
| Pressure | 100 mbar |

Step 5: Nucleation step

| | |
|---|---|
| Gas mixture | $AlCl_3$ = 3.2% |
| | HCL = 2.0% |

-continued

Step 5: Nucleation step

| | |
|---|---|
| | $CO_2$ = 1.9% |
| | Balance $H_2$ |
| Duration | 60 min |
| Temperature | 1000° C. |
| Pressure | 210 mbar |

Step 6: Deposition

| | |
|---|---|
| Gas mixture | $AlCl_3$ = 4.2% |
| | HCL = 1.0% |
| | $CO_2$ = 2.1% |
| | $H_2S$ = 0.2% |
| | Balance: $H_2$ |
| Duration | 420 min |
| Temperature | 1000° C. |
| Pressure | 50 mbar |

EXAMPLE 2

The coatings a) and b) from the example 1 were tested with respect to edge toughness in longitudinal turning.

| | |
|---|---|
| Work piece: | Cylindrical bar |
| Material: | SS0130 |
| Insert type: | SNUN |
| Cutting speed: | 400 m/min |
| Feed: | 0.4 mm/rev |
| Depth of cut: | 2.5 mm |
| Remarks: | dry turning |

The inserts were inspected after 2 and 4 minutes of cutting. As clear from Table 2 the edge toughness of the conventional product was considerably enhanced when the coating was produced according to this invention.

TABLE 2

| | Flaking of the edge line (%) after 2 minutes | Flaking of the edge line (%) After 6 minutes |
|---|---|---|
| Coating a (Invention) | 0 | <1 |
| Coating b | 38 | 62 |

EXAMPLE 3

The coating produced according to this invention was compared with a market leader, referred to here as Competitor X. This coating is composed of MTCVD Ti(C,N) and $\alpha$-$Al_2O_3$. X-ray diffraction analysis (XRD) was used to determine the texture coefficients for these competitor coatings. Two inserts from Competitor X were randomly chosen for XRD. Table 3 shows the TCs obtained for the Competitor X. The coatings from Competitor X exhibit a (110) texture.

TABLE 3

| hkl | TC(hkl) | |
|-----|---------|------|
| 012 | 0.64 | 0.59 |
| 104 | 0.95 | 0.88 |
| 110 | 1.75 | 2.00 |
| 113 | 0.45 | 0.42 |
| 024 | 1.15 | 1.10 |
| 116 | 1.07 | 1.01 |

EXAMPLE 4

The inserts from the competitor X were compared with inserts produced according to the present invention with the same substrate composition and the same coating structure. Before the tests the both inserts produced according to this invention were examined by XRD. The strong (012) texture was confirmed.

Two inserts produced according to this invention were compared with two Competitor X inserts with respect to flank wear resistance in face turning of ball bearing material

| Work piece: | Cylindrical tubes(Ball bearings) |
|---|---|
| Material: | SS2258 |
| Insert type: | WNMG080416 |
| Cutting speed: | 500 m/min |
| Feed: | 0.5 mm/rev |
| Depth of cut: | 1.0 mm |
| Remarks: | Dry turning |

Tool life criterion: Flank wear >0.3 μm, three edges of each variant were tested.

| Results: | Tool life (min) |
|---|---|
| Coating 1 | 22 (invention) |
| Coating 2 | 23.5 (invention) |
| Competitor 1 | 15.5 (conventional) |
| Competitor 2 | 13 (conventional) |

EXAMPLE 5

Cubic boron nitride (CBN) inserts containing about 90% of polycrystalline CBN (PCBN) were coated according to this invention and according to conventional coating techniques discussed in Example 1. The coated CBN was compared with uncoated CBN insert in cutting of steel containing ferrite. It is known that boron has a high affinity to ferrite and diffusion wear occurs at high cutting speeds.

| Work piece: | Cylindrical bar |
|---|---|
| Material: | SS0130 |
| Insert type: | SNUN |
| Cutting speed: | 860 m/min |
| Feed: | 0.4 mm/rev |
| Depth of cut: | 2.5 mm |
| Remarks: | dry turning |

| | Life time (min) |
|---|---|
| Coated CBN (Invention) | 22 |
| Conventional coating | 14 |
| Uncoated CBN | 11 |

The described embodiments of the present invention are intended to be illustrative rather than restrictive, and are not intended to represent every possible embodiment of the present invention. Various modifications can be made to the disclosed embodiments without departing from the spirit or scope of the invention as set forth in the following claims, both literally and in equivalents recognized in law.

I claim:

1. A cutting tool insert comprising a substrate having a surface at least partially coated with a coating, the coating having a total thickness of about 10–40 μm, one or more refractory layers of which at least one layer is an alumina layer, the alumina layer comprising columnar $\alpha$-$Al_2O_3$ grains with texture coefficients expressed as TC(hkl) of:
   a) TC(012) and TC(024) both >1.8
   wherein the texture coefficient TC(hkl) is defined as:

$$TC(hkl) = \frac{I(hkl)}{I_0(hkl)} \left\{ \frac{1}{n} \sum \frac{I(hkl)}{I_0(hkl)} \right\}^{-1}$$

where
I(hkl)=measured intensity of the (hkl) reflection
$I_0$(hkl)=standard intensity according to JCPDS card no 46-1212
n=number of reflections used in the calculation
(hkl) reflections used are: (012), (104), (110), (113), (024), (116), and
wherein the coating comprises a first layer adjacent the substrate of CVD Ti(C,N), MTCVD Ti(C,N), or combination thereof, and a bonding layer including an Al concentration gradient deposited on the first layer.

2. The cutting tool insert according to claim 1, wherein the total thickness of the coating is about 15–25 μm.

3. The cutting tool insert according to claim 1, with the texture coefficients, expressed as TC(hkl) of:
   a) TC(012) and TC(024) both >1.8; and
   b) TC(104), TC(110), TC(113) and TC(116) all <0.3.

4. The cutting tool insert according to claim 1, wherein the alumina layer is composed of columnar grains with a length/width ratio of about 2 to 12.

5. The cutting tool insert according to claim 4, wherein the length/width with ratio is about 5 to 9.

6. The cutting tool insert according to claim 1, wherein the substrate comprises cemented carbide, CBN or sintered CBN alloy.

7. The cutting tool insert according to claim 1, wherein the first layer has a thickness of about 1 to 20 μm, and the $\alpha$-$Al_2O_3$ layer applied to the bonding layer has a thickness of from about 1 to 40 μm.

8. The cutting tool insert according to claim 7, wherein the first layer has a thickness of about 1–10 μm and the $\alpha$-$Al_2O_3$ layer has a thickness of about 1–20 μm.

9. The cutting tool insert according to claim 8, wherein the $\alpha$-$Al_2O_3$ layer has a thickness of about 1 μm to 10 μm.

10. The cutting tool insert according to claim 1, wherein the $\alpha$-$Al_2O_3$ layer is the uppermost layer.

11. The cutting tool insert according to claim 1, further comprising an additional layer of carbide, nitride, carbonitride or carboxynitride of one or more of Ti, Zr and Hf, having a thickness of about 0.5 to 3 μm atop the α-$Al_2O_3$ layer.

12. The cutting tool insert according to claim 11, wherein the additional layer has a thickness of about 0.5–1.5 μm.

13. The cutting tool insert according to claim 1, further comprising an additional layer of carbide, nitride, carbonitride or carboxynitride of one or more of Ti, Zr and Hf, having a thickness of about 1 to 20 μm atop the α-$Al_2O_3$ layer.

14. The cutting tool insert according to claim 13, wherein the additional layer has a thickness of about 2–8 μm.

15. The cutting tool insert according to claim 1, further comprising a layer of κ-$Al_2O_3$ or γ-$Al_2O_3$ atop the α-$Al_2O_3$ with a thickness of about 0.5–10 μm.

16. The cutting tool insert according to claim 15, wherein the κ-$Al_2O_3$ or γ-$Al_2O_3$ layer has a thickness of about 1–5 μm.

17. The cutting tool insert according to claim 1, further comprising a layer of TiN between the substrate and said first layer with a thickness of <3 μm.

18. The cutting tool insert according to claim 17, wherein the layer of TiN has a thickness of about 0.5–2 μm.

19. The cutting tool insert according to claim 1, wherein the substrate comprises a cemented carbide with a binder phase enriched surface zone.

20. The cutting tool insert according to claim 1, wherein the bonding layer includes Ti(C,N,O).

21. The cutting tool insert according to claim 1, wherein the bonding layer includes a nitrogen species.

22. The cutting tool insert according to claim 1, wherein TC(104), TC(110), TC(113) and TC(116) all <0.4.

23. The cutting tool insert comprising a substrate having a surface at least partially coated with a coating, the coating having a total thickness of about 10–40 μm, one or more refractory layers of which at least one layer is an alumina layer, the alumina layer comprising columnar α-$Al_2O_3$ grains with texture coefficients expressed as TC(hkl) of TC(012) and TC(024) both >1.8, wherein the texture coefficient TC(hkl) is defined as:

$$TC(hkl) = \frac{I(hkl)}{I_0(hkl)} \left\{ \frac{1}{n} \sum \frac{I(hkl)}{I_0(hkl)} \right\}^{-1}$$

where

I(hkl)=measured intensity of the (hkl) reflection $I_0$(hkl)=standard intensity according to JCPDS card no 46-1212 n=number of reflections used in the calculation (hkl) reflections used are (012), (104), (110), (113), (024), (116), and wherein the coating comprises a first layer adjacent the substrate of CVD TiN, CVD TiC, MTCVD Zr(C,N), MTCVD Ti(B,C,N), CVD HfN or combinations thereof, and a bonding layer including an Al concentration gradient deposited on the first layer.

24. The cutting tool insert according to claim 23, wherein the first layer has a thickness of about 1 to 20 μm, and the α-$Al_2O_3$ layer applied to the bonding layer has a thickness of from about 1 to 40 μm.

25. The cutting tool insert according to claim 23, wherein the bonding layer includes Ti(C,N,O).

26. The cutting tool insert according to claim 23, wherein TC(104), TC(110), TC(113) and TC(116) all <0.4.

27. The cutting tool insert according to claim 23, wherein the alumina layer is composed of columnar grains with a length/width ratio of about 2 to 12.

28. The cutting tool insert according to claim 23, wherein the α-$Al_2O_3$ layer is the uppermost layer.

29. The cutting tool insert according to claim 23, further comprising an additional layer of carbide, nitride, carbonitride or carboxynitride of one or more of Ti, Zr and Hf, having a thickness of about 1 to 20 μm atop the α-$Al_2O_3$ layer.

30. The cutting tool insert according to claim 23, further comprising a layer of κ-$Al_2O_3$ or γ-$Al_2O_3$ atop the α-$Al_2O_3$ with a thickness of about 0.5–μm.

31. The cutting tool insert according to claim 23, further comprising a layer of TiN between the substrate and said first layer with a thickness of <3 μm.

32. The cutting tool insert according to claim 23, wherein the substrate comprises a cemented carbide with a binder phase enriched surface zone.

33. The cutting tool insert according to claim 23, wherein the substrate comprises cemented carbide, CBN or sintered CBN alloy.

* * * * *